(12) United States Patent
Kang (10) Patent No.: US 9,536,934 B2
(45) Date of Patent: Jan. 3, 2017

(54) OLED ARRAY SUBSTRATE

(71) Applicant: BOE TECHNOLOGY GROUP CO., LTD., Beijing (CN)

(72) Inventor: Pengtao Kang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/424,779

(22) PCT Filed: Apr. 30, 2014

(86) PCT No.: PCT/CN2014/076620
§ 371 (c)(1),
(2) Date: Feb. 27, 2015

(87) PCT Pub. No.: WO2015/085703
PCT Pub. Date: Jun. 18, 2015

(65) Prior Publication Data
US 2016/0049453 A1    Feb. 18, 2016

(30) Foreign Application Priority Data

Dec. 12, 2013  (CN) .......................... 2013 1 0682551

(51) Int. Cl.
*H01L 29/66* (2006.01)
*H01L 27/32* (2006.01)
(Continued)

(52) U.S. Cl.
CPC ....... *H01L 27/3262* (2013.01); *H01L 27/1237* (2013.01); *H01L 27/1259* (2013.01);
(Continued)

(58) Field of Classification Search
None
See application file for complete search history.

(56) References Cited

U.S. PATENT DOCUMENTS

2004/0075783 A1  4/2004  Lee
2005/0156514 A1*  7/2005  Park ..................... H01L 27/3251
                                              313/504
(Continued)

FOREIGN PATENT DOCUMENTS

CN       1655655 A      8/2005
CN       1716532 A      1/2006
(Continued)

OTHER PUBLICATIONS

Office Action dated Sep. 16, 2014 issued in corresponding Chinese Application No. 201310682551.6.
(Continued)

*Primary Examiner* — Thao P Le
(74) *Attorney, Agent, or Firm* — Nath, Goldberg & Meyer; Joshua B. Goldberg; Christopher Thomas (57) ABSTRACT

The present invention provides an OLED array substrate, a manufacturing method of the same, a display panel, and a display device, and relates to the field of active matrix organic light-emitting diode (AMOLED) display technology. The present invention can solve the problem that turn-on and turn-off of a switching thin film transistor and grayscale control cannot be performed effectively because the switching thin film transistor and a driving thin film transistor are manufactured as thin film transistors having same performance parameters in an existing OLED array substrate. The OLED array substrate according to the present invention includes a switching thin film transistor and a driving thin film transistor, wherein, an S factor of the switching thin film transistor is less than that of the driving thin film transistor.

2 Claims, 3 Drawing Sheets

(51) Int. Cl.
  *H01L 29/786* (2006.01)
  *H01L 29/423* (2006.01)
  *H01L 27/12* (2006.01)

(52) U.S. Cl.
  CPC .... *H01L 27/3244* (2013.01); *H01L 29/42364* (2013.01); *H01L 29/42384* (2013.01); *H01L 29/66757* (2013.01); *H01L 29/78675* (2013.01); *H01L 2227/323* (2013.01)

(56) References Cited

U.S. PATENT DOCUMENTS

| | | | | |
|---|---|---|---|---|
| 2005/0242745 | A1* | 11/2005 | Jung | G09G 3/3233 315/169.3 |
| 2006/0164359 | A1* | 7/2006 | Kimura | G09G 3/2014 345/92 |
| 2007/0045628 | A1 | 3/2007 | Kim et al. | |
| 2014/0158995 | A1* | 6/2014 | Park | H01L 27/3262 257/40 |
| 2015/0014641 | A1* | 1/2015 | Jung | H01L 27/3262 257/40 |
| 2015/0243720 | A1* | 8/2015 | Kwon | H01L 27/1248 257/40 |
| 2016/0126293 | A1* | 5/2016 | Li | H01L 27/286 257/29 |

FOREIGN PATENT DOCUMENTS

| | | |
|---|---|---|
| CN | 101542735 A | 9/2009 |
| CN | 101593730 A | 12/2009 |
| CN | 103022355 A | 4/2013 |
| CN | 103258855 A | 8/2013 |
| CN | 103456765 A | 12/2013 |
| CN | 103715226 A | 4/2014 |
| JP | 2003223120 A | 8/2003 |

OTHER PUBLICATIONS

Office Action dated Dec. 16, 2014 issued in corresponding Chinese Application No. 201310682551.6.
Written Opinion of the International Searching Authority dated Sep. 15, 2014 issued in corresponding International Application No. PCT/CN2014/076620.
International Patent Application No. PCT/CN2014/076620, International Search Report dated Sep. 16, 2014, fifteen (15) pages.

* cited by examiner

OLED ARRAY SUBSTRATE

This is a National Phase Application filed under 35 U.S.C. 371 as a national stage of PCT/CN2014/076620, filed Apr. 30, 2014, and claims priority benefit from Chinese Application No. 201310682551.6, filed Dec. 12, 2013, the content of each of which is hereby incorporated by reference in its entirety.

FIELD OF THE INVENTION

The present invention relates to the field of active matrix organic light-emitting diode (AMOLED) display technology, in particular, relates to an OLED array substrate, a manufacturing method of the same, a display panel, and a display device.

BACKGROUND OF THE INVENTION

As compared with a thin film transistor-liquid crystal display (TFT-LCD) which is the mainstream of existing display technologies, an organic light-emitting diode (OLED) display has advantages of wide viewing angle, high brightness, high contrast, low power consumption, smaller volume and lighter weight, and the like, and is the focus of attention among current flat panel display technologies.

Figure 1:
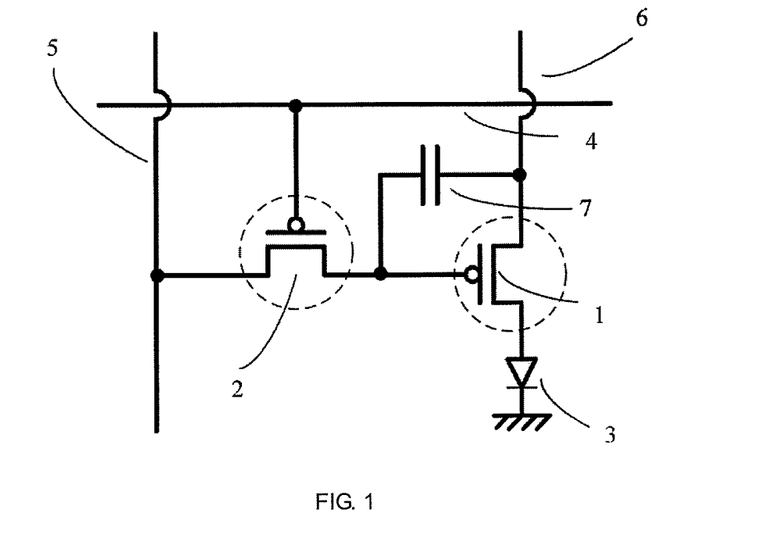
FIG. 1 is a diagram showing the basic principle of an active matrix organic light-emitting diode (AMOLED) display in the prior art.

Driving methods of organic light-emitting diode displays are classified into two types of passive matrix (PM) and active matrix (AM). As compared with passive matrix driving, active matrix driving has advantages of large amount of display information, low power consumption, long service life of a device, high contrast screen, and the like. At present, an active matrix organic light-emitting diode (AMOLED) display mainly uses a low temperature polysilicon-thin film transistor (LTPS-TFT) to drive an OLED to emit light. As shown in FIG. 1, an active matrix organic light-emitting diode display device generally includes a switching thin film transistor 2, a driving thin film transistor 1, and an organic light-emitting diode (OLED) 3. A gate of the switching thin film transistor 2 is connected to a scan line 4. A drain (or source) of the switching thin film transistor 2 is connected to a data line 5, and a source (or drain) of the switching thin film transistor 2 is connected to a gate of the driving thin film transistor 1. A source (or drain) of the driving thin film transistor 1 is connected to a power line 6, and a drain (or source) of the driving thin film transistor 1 is connected to an anode of the OLED 3. A cathode of the OLED 3 is grounded, and a storage capacitor 7 is connected between the source (or drain) and the gate of the driving thin film transistor 1. Generally, the switching thin film transistor 2 is required to have a small S factor (subthreshold swing) such that an electric current changes with a voltage greatly, whereas the driving thin film transistor 1 is required to have a large S factor such that an electric current changes with a voltage slightly. Thus, it can be ensured that the switching thin film transistor 2 has a better switching performance, which facilitates grayscale control. However, in the prior art, the switching thin film transistor 2 and the driving thin film transistor 1 are manufactured as thin film transistors having the same performance parameters, which is not helpful for effective turn-on and turn-off of the switching thin film transistor and the grayscale control.

SUMMARY OF THE INVENTION

In view of the above problem present in an existing OLED array substrate, the technical problem to be solved by an embodiment of the present invention includes providing an OLED array substrate, a manufacturing method of the same, a display panel, and a display device, wherein, an S factor of a switching thin film transistor is less than that of a driving thin film transistor.

A technical solution employed to solve the technical problem of an embodiment of the present invention is an OLED array substrate including a switching thin film transistor and a driving thin film transistor, wherein, an S factor of the switching thin film transistor is less than that of the driving thin film transistor.

Preferably, each of the switching thin film transistor and the driving thin film transistor includes an active region, a gate, and a gate insulating layer insulatedly separating the active region and the gate from each other, the gate insulating layer of the driving thin film transistor has a first thickness, the gate insulating layer of the switching thin film transistor has a second thickness, and the first thickness is greater than the second thickness.

Preferably, a thickness of the gate insulating layer of the switching thin film transistor ranges from 600 nm to 800 nm; and a thickness of the gate insulating layer of the driving thin film transistor ranges from 800 nm to 2000 nm.

Preferably, the switching thin film transistor is a top-gate type thin film transistor or a bottom-gate type thin film transistor; and the driving thin film transistor is a top-gate type thin film transistor or a bottom-gate type thin film transistor.

A technical solution employed to solve the technical problem of an embodiment of the present invention is a manufacturing method of an OLED array substrate, including steps of:

forming a pattern including an active region of a switching thin film transistor and an active region of a driving thin film transistor on a base substrate by a patterning process;

forming a pattern including a gate insulating layer of the driving thin film transistor and a gate insulating layer of the switching thin film transistor on the base substrate on which the preceding step is finished by a patterning process, so that the gate insulating layer of the driving thin film transistor has a first thickness, the gate insulating layer of the switching thin film transistor has a second thickness, and the first thickness is greater than the second thickness; and forming a pattern including a gate of the switching thin film transistor and a gate of the driving thin film transistor on the base substrate on which the preceding steps are all finished by a patterning process.

Preferably, the step of forming a pattern including a gate insulating layer of the driving thin film transistor and a gate insulating layer of the switching thin film transistor on the base substrate on which the preceding step is finished by a patterning process, so that the gate insulating layer of the driving thin film transistor has a first thickness, the gate insulating layer of the switching thin film transistor has a second thickness, and the first thickness is greater than the second thickness specifically includes steps of:

forming the gate insulating layer having the first thickness on the base substrate on which the active region of the switching thin film transistor and the active region of the driving thin film transistor are formed;

coating a layer of photoresist on the gate insulating layer having the first thickness on the base substrate on which the preceding steps are all finished;

removing the photoresist on the gate insulating layer of the switching thin film transistor on the base substrate on which the preceding steps are all finished;

thinning the gate insulating layer of the switching thin film transistor so as to form the gate insulating layer having the second thickness on the base substrate on which the preceding steps are all finished; and removing the photoresist on the driving thin film transistor on the base substrate on which the preceding steps are all finished.

Preferably, the step of forming a pattern including a gate insulating layer of the driving thin film transistor and a gate insulating layer of the switching thin film transistor on the base substrate on which the preceding step is finished by a patterning process, so that the gate insulating layer of the driving thin film transistor has a first thickness, the gate insulating layer of the switching thin film transistor has a second thickness, and the first thickness is greater than the second thickness specifically includes steps of:

forming the gate insulating layer having a third thickness on the base substrate on which the active region of the switching thin film transistor and the active region of the driving thin film transistor are formed;

coating photoresist on the gate insulating layer of the driving thin film transistor on the base substrate on which the preceding steps are all finished;

removing the exposed gate insulating layer of the switching thin film transistor on the base substrate on which the preceding steps are all finished;

removing the photoresist on the driving thin film transistor on the base substrate on which the preceding steps are all finished; and forming a gate insulating layer having a fourth thickness on the base substrate on which the preceding steps are all finished, so that the gate insulating layer of the driving thin film transistor having the first thickness, and the gate insulating layer of the switching thin film transistor having the second thickness are obtained.

A technical solution employed to solve the technical problem of an embodiment of the present invention is a manufacturing method of an OLED array substrate, including steps of:

forming a pattern including a gate of a switching thin film transistor and a gate of a driving thin film transistor on a base substrate by a patterning process;

forming a pattern including a gate insulating layer of the driving thin film transistor and a gate insulating layer of the switching thin film transistor on the base substrate on which the preceding step is finished by a patterning process, so that the gate insulating layer of the driving thin film transistor has a first thickness, the gate insulating layer of the switching thin film transistor has a second thickness, and the first thickness is greater than the second thickness; and forming a pattern including an active region of the switching thin film transistor and an active region of the driving thin film transistor on the base substrate on which the preceding steps are all finished by a patterning process.

A technical solution employed to solve the technical problem of an embodiment of the present invention is a display panel including the OLED array substrate as described above.

A technical solution employed to solve the technical problem of an embodiment of the present invention is a display device including the display panel as described above.

In the OLED array substrate according to an embodiment of the present invention, the thickness of the gate insulating layer of the driving thin film transistor is greater than that of the gate insulating layer of the switching thin film transistor. Since an S factor of a thin film transistor is positively correlated with a thickness of a gate insulating layer thereof, an S factor of the driving thin film transistor is greater than that of the switching thin film transistor. In this case, an electric current changes with a voltage more greatly in the switching thin film transistor because the S factor of the switching thin film transistor is smaller, whereas an electric current changes with a voltage more slightly in the driving thin film transistor because the S factor of the driving thin film transistor is larger. Thus, it can be ensured that the switching thin film transistor has higher, switching performance and display of grayscale can be controlled better.

REFERENCE NUMERALS

1—driving thin film transistor; 2—switching thin film transistor; 3—OLED; 4—scan line; 5—data line; 6—power line; 7—storage capacitor; 10—base substrate; 11—active region; 12-1—first thickness; 12-2—second thickness; 12-3—third thickness; 13—protection layer; 14—gate; 15—planarization layer; 16—contact via; 17—source and drain; and 20—photoresist.

DETAILED DESCRIPTION OF THE EMBODIMENTS

For better understanding the technical solutions of an embodiment of the present invention by a person skilled in the art, an embodiment of the present invention will be further described in detail with reference to the drawings and specific embodiments.

Embodiment 1

Figure 2:
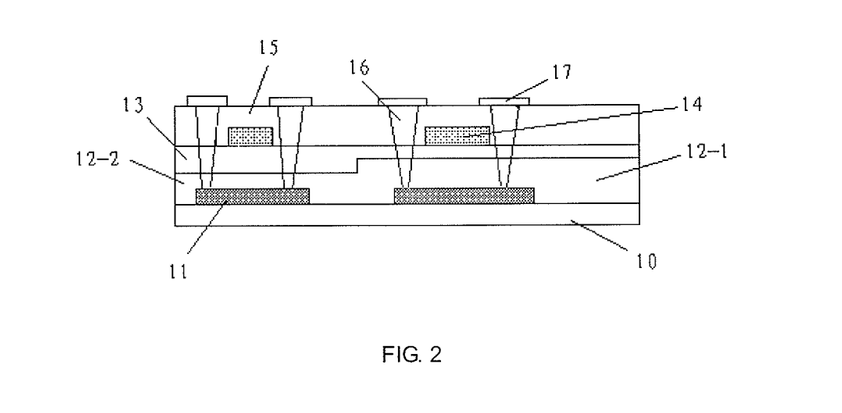
FIG. 2 is a schematic diagram showing an OLED array substrate according to Embodiment 1 of the present invention.

As shown in FIG. 2, the present embodiment provides an OLED array substrate, which includes a switching thin film transistor 2 and a driving thin film transistor 1. An S factor of the switching thin film transistor is less than that of the driving thin film transistor.

In the present embodiment, the S factor of the driving thin film transistor 1 is greater than that of the switching thin film transistor 2. In this case, an electric current changes with a voltage more greatly in the switching thin film transistor 2 because the S factor of the switching thin film transistor 2 is relatively smaller, whereas an electric current changes with a voltage more slightly in the driving thin film transistor 1 because the S factor of the driving thin film transistor 1 is relatively larger. Thus, it can be ensured that the switching thin film transistor 2 has higher switching performance and display of grayscale can be controlled better.

Preferably, in the OLED array substrate according to the present embodiment, each of the switching thin film transistor 2 and the driving thin film transistor 1 includes an active region 11, a gate 14, and a gate insulating layer insulatedly separating the active region 11 and the gate 14 from each other. The gate insulating layer covers the active region 11, and a protection layer 13 may be further provided on the gate insulating layer. The gate insulating layer of the driving thin film transistor 1 has a first thickness 12-1, and the gate insulating layer of the switching thin film transistor 2 has a second thickness 12-2, the first thickness 12-1 being greater than the second thickness 12-2.

In a manufacturing process of a thin film transistor, a thickness of a gate insulating layer affects variation of an S factor to a great extend. Experiments have shown that, in a case where other parameters of the thin film transistor are given, the larger the thickness of the gate insulating layer is, the greater the S factor is. In the OLED array substrate according to the present embodiment, the thickness of the gate insulating of the driving thin film transistor 1 is greater than that of the gate insulating of the switching thin film transistor 2, that is, the S factor of the driving thin film transistor 1 is larger than that of the switching thin film transistor 2. In this case, an electric current changes with a voltage more greatly in the switching thin film transistor 2 because the S factor of the switching thin film transistor 2 is relatively smaller, whereas an electric current changes with a voltage more slightly in the driving thin film transistor 1 because the S factor of the driving thin film transistor 1 is relatively larger. Thus, it can be ensured that the switching thin film transistor 2 has higher switching performance and display of grayscale can be controlled better.

Preferably, the thickness (the second thickness 12-2) of the gate insulating layer of the switching thin film transistor 2 ranges from 600 nm to 800 nm, and the thickness (the first thickness 12-1) of the gate insulating layer of the driving thin film transistor 1 ranges from 800 nm to 2000 nm. Of course, the thickness of the gate insulating layer of the switching thin film transistor 2 and the thickness of the gate insulating layer of the driving thin film transistor 1 are not limited thereto, and can be adjusted according to practical situation, as long as it is ensured that the thickness of the gate insulating layer of the driving thin film transistor 1 is greater than the thickness of the gate insulating layer of the switching thin film transistor 2.

A material of each of the gate insulating layer of the switching thin film transistor 2 and the gate insulating layer of the driving thin film transistor 1 may be one of silicon oxide (SiOx), silicon nitride (SiNx), hafnium oxide (HfOx), silicon oxynitride (SiON), aluminum oxide (AlOx), or may be a multi-layered composite film made of two materials among the above listed materials.

Preferably, the switching thin film transistor 2 is a top-gate type thin film transistor or a bottom-gate type thin film transistor, and the driving thin film transistor 1 is a top-gate type thin film transistor or a bottom-gate type thin film transistor.

In a case where each of the switching thin film transistor 2 and the driving thin film transistor 1 is a top-gate type thin film transistor, the top-gate type thin film transistor includes the active region 11, the gate insulating layer, the gate 14, a planarization layer 15, a source and a drain 17 which are sequentially provided on a base substrate 10, wherein, the source and the drain 17 are respectively connected to the active region 11 through contact vias 16 which penetrate through the gate insulating layer and the planarization layer 15. In a case where each of the switching thin film transistor 2 and the driving thin film transistor 1 is a bottom-gate type thin film transistor, the bottom-gate type thin film transistor includes the gate 14, the gate insulating layer, the active region 11, an etch stop layer, the source and the drain 17 which are sequentially provided on the base substrate 10, wherein, the source and the drain 17 are respectively connected to the active region 11 through contact vias 16 which penetrate through the etch stop layer.

It should be noted that, a type of the switching thin film transistor 2 may be the same type as that of the driving thin film transistor 1. In this case, respective layers of the switching thin film transistor 2 and the driving thin film transistor 1 may be formed simultaneously during fabrication. As a result, manufacturing procedure is simplified, cost is saved, and productivity is increased. Of course, a type of the switching thin film transistor 2 may be different from that of the driving thin film transistor 1. In this case, the switching thin film transistor 2 and the driving thin film transistor 1 may be formed separately during fabrication. As long as it is ensured that the thickness of the gate insulating layer of the driving thin film transistor 1 is greater than the thickness of the gate insulating layer of the switching thin film transistor 2 in the OLED array substrate, regardless of whether a type of the switching thin film transistor 2 is the same type as that of the driving thin film transistor 1 or not.

It should be further noted that, in addition to the thickness of the gate insulating layer, other factors such as an active layer may affect the magnitude of the S factor of a thin film transistor. The thickness of the gate insulating layer is merely taken as an example in the present embodiment. Of course, all implementations in which it is ensured that the S factor of the switching thin film transistor 2 is smaller than the S factor of the driving thin film transistor 1 fall within the protection scope of the present invention.

The OLED array substrate provided by the present embodiment further includes elements such as a storage capacitor, an organic electroluminescent device, and the like. All implementations in which the thickness of the gate insulating layer of the driving thin film transistor 1 is greater than the thickness of the gate insulating layer of the switching thin film transistor 2 in the OLED array substrate fall within the protection scope of the present invention.

Embodiment 2

Figure 3:
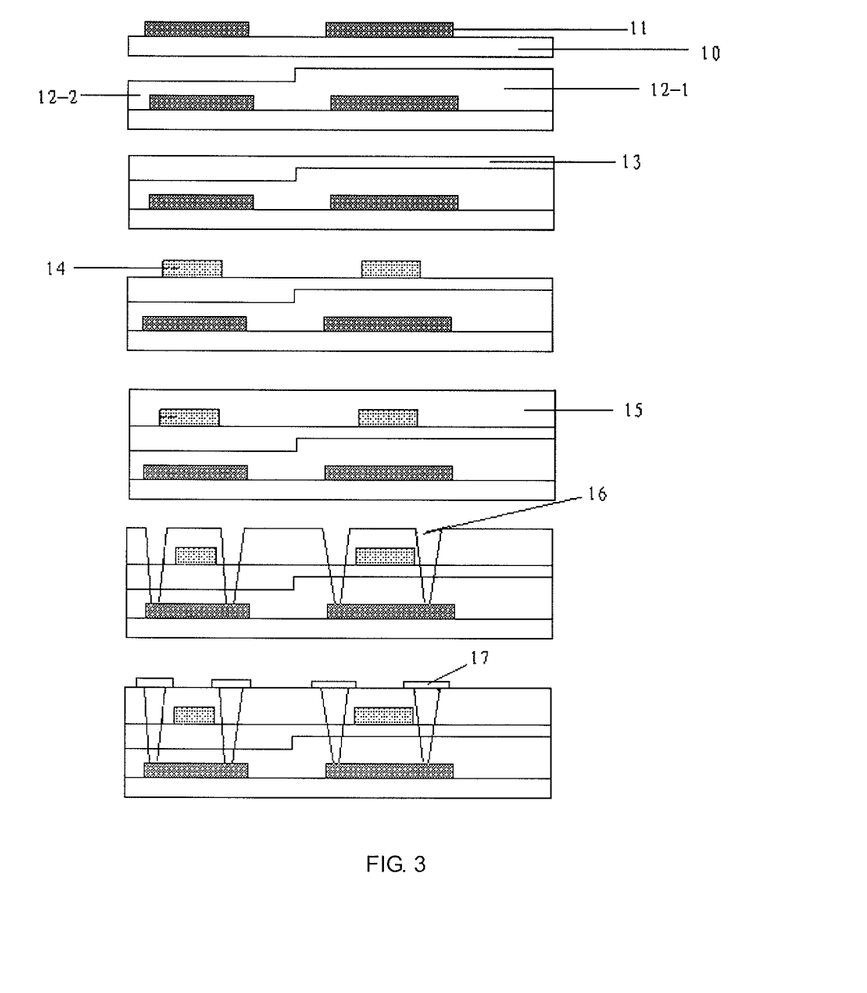
FIG. 3 is a flowchart showing a manufacturing method of an OLED array substrate according to Embodiment 2 of the present invention.

As shown in FIG. 3, the present embodiment provides a manufacturing method of an OLED array substrate which includes the switching thin film transistor 2 and the driving thin film transistor 1, wherein, each of the switching thin film transistor 2 and the driving thin film transistor 1 may be a top-gate type thin film transistor or a bottom-gate type thin film transistor. In a case where each of the switching thin film transistor 2 and the driving thin film transistor 1 is a top-gate type thin film transistor, the manufacturing method of an OLED array substrate specifically includes the following steps:

Step I: forming the active regions 11 of the switching thin film transistor 2 and the driving thin film transistor 1 on the base substrate 10 by processes such as sputtering, exposure, development, etching, stripping off, and the like.

The active regions 11 may be made of polysilicon, and of course may be made of another polymeric material.

Step II: forming a pattern including the gate insulating layer of the driving thin film transistor 1 and the gate insulating layer of the switching thin film transistor 2 on the base substrate 10 on which the preceding step is finished, so that the gate insulating layer of the driving thin film transistor 1 has a first thickness 12-1, the gate insulating layer of the switching thin film transistor 2 has a second thickness 12-2, and the first thickness 12-1 is greater than the second thickness 12-2.

Figure 4:
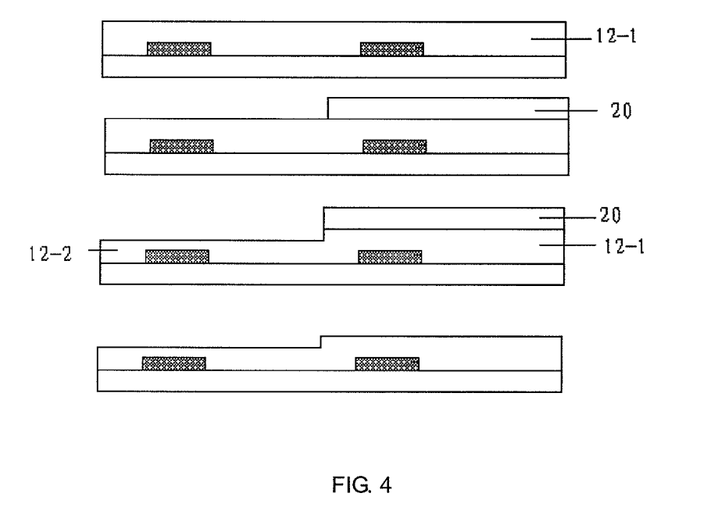
FIG. 4 is a flowchart showing a manufacturing method of a gate insulating layer of a driving thin film transistor and a gate insulating layer of a switching thin film transistor in the OLED array substrate according to Embodiment 2 of the present invention.

As shown in FIG. 4, preferably, the Step II specifically includes the following steps:

S1: forming a gate insulating layer having the first thickness 12-1 by a process such as plasma enhanced chemical vapor deposition (PECVD) or the like.

S2: coating a layer of photoresist 20 on the gate insulating layer having the first thickness 12-1 on the base substrate 10 on which the preceding steps are all finished.

S3: etching and removing the photoresist 20 on the gate insulating layer of the switching thin film transistor 2.

S4: thinning the gate insulating layer of the switching thin film transistor 2 so as to form the gate insulating layer, which has the second thickness 12-2, of the switching thin film transistor 2; that is, the gate insulating layer where is not covered by the photoresist 20 is removed by a certain thickness, so that the thickness of the gate insulating layer on the active region 11 of the switching thin film transistor 2 is the second thickness 12-2.

S5: stripping off the photoresist 20, so that the gate insulating layer of the driving thin film transistor 1 has the first thickness 12-1, and the gate insulating layer of the switching thin film transistor 2 has the second thickness 12-2 in the end.

Figure 5:
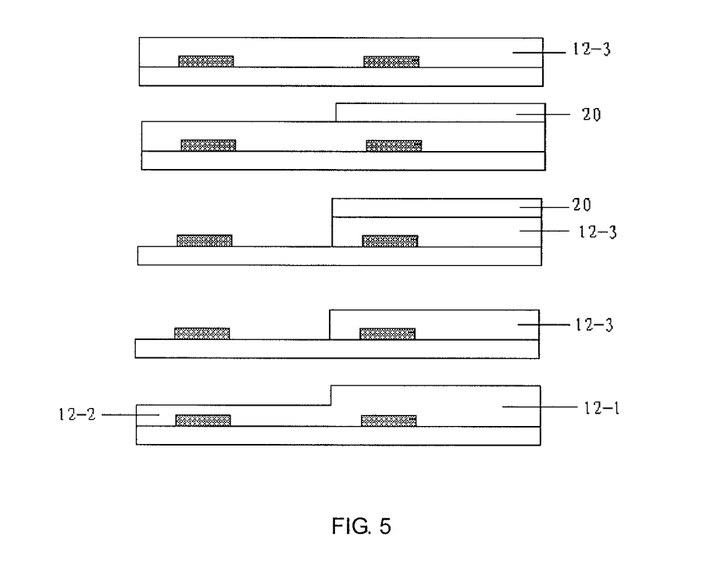
FIG. 5 is a flowchart showing another manufacturing method of the gate insulating layer of the driving thin film transistor and the gate insulating layer of the switching thin film transistor in the OLED array substrate according to Embodiment 2 of the present invention.

As shown in FIG. 5, preferably, the step of forming a pattern including a gate insulating layer of the driving thin film transistor 1 and a gate insulating layer of the switching thin film transistor 2, so that the gate insulating layer of the driving thin film transistor 1 has the first thickness 12-1, and the gate insulating layer of the switching thin film transistor 2 has the second thickness 12-2 may alternatively includes the following steps:

S1: forming a gate insulating layer having a third thickness 12-3 by a process such as plasma enhanced chemical vapor deposition (PECVD) or the like, wherein, the third thickness 12-3 is smaller than the first thickness 12-1.

S2: coating a layer of photoresist 20 on the gate insulating layer of the driving thin film transistor 1 on the base substrate 10 on which the preceding steps are all finished.

S3: removing the exposed gate insulating layer of the switching thin film transistor 2 on the base substrate 10 on which the preceding steps are all finished.

S4: removing the photoresist 20 on the driving thin film transistor 1 on the base substrate 10 on which the preceding steps are all finished.

S5: forming a gate insulating layer having a fourth thickness on the base substrate 10 on which the preceding steps are all finished, so that the gate insulating layer of the driving thin film transistor 1 having the first thickness 12-1 and the gate insulating layer of the switching thin film transistor 2 having the second thickness 12-2 are obtained.

Each of the gate insulating layers may be made of one of silicon oxide (SiOx), silicon nitride (SiNx), hafnium oxide (HfOx), silicon oxynitride (SiON), aluminum oxide (AlOx), or may be a multi-layered composite film made of two materials among the above listed materials.

Of course, a method for forming a pattern including the gate insulating layer of the driving thin film transistor 1 and the gate insulating layer of the switching thin film transistor 2, so that the gate insulating layer of the driving thin film transistor 1 has the first thickness 12-1, and the gate insulating layer of the switching thin film transistor 2 has the second thickness 12-2 is not limited to the two method as described above. For example, the gate insulating layer of the driving thin film transistor 1 having the first thickness 12-1 may be formed firstly, and then the gate insulating layer of the switching thin film transistor 2 having the second thickness 12-2 is formed. The order of these two steps may be reversed.

Step III: forming the protection layer 13 on the base substrate 10 on which the preceding steps are all finished. The protection layer 13 makes the base substrate planar, which facilitates completion of subsequent steps. Of course, the present step can be omitted.

The protection layer 13 may be made of any one of silicon oxide (SiOx), silicon nitride (SiNx), hafnium oxide (HfOx), silicon oxynitride (SiON), aluminum oxide (AlOx), and an organic material, or may be made of combination of several materials among the above listed materials.

Step IV: forming the gates 14 of the switching thin film transistor 2 and the driving thin film transistor 1 on the base substrate 10 on which the preceding steps are all finished by processes such as sputtering, exposure, development, etching, stripping off, and the like.

Each of the gates 14 may be made of one of molybdenum (Mo), molybdenum-niobium alloy (MoNb), aluminum (Al), aluminum-neodymium alloy (AlNd), tungsten (W), titanium (Ti), and copper (Cu), or each of the gates 14 may be of single-layered or may be a multi-layered composite laminated layer which is made of several materials among the above listed materials.

Step V: forming the planarization layer 15 on the base substrate 10 on which the preceding steps are all finished.

The planarization layer 15 may be made of any one of silicon oxide (SiOx), silicon nitride (SiNx), hafnium oxide (HfOx), silicon oxynitride (SiON), aluminum oxide (AlOx), and an organic material, or may be made of combination of several materials among the above listed materials.

Step VI: forming the contact vias 16 which penetrate through the protection layer 13, the planarization layer 15, and the respective gate insulating layers and correspond to the sources and the drains 17 of the switching thin film transistor 2 and the driving thin film transistor 1 on the base substrate 10 on which the preceding steps are all finished.

Step VII: forming a pattern including the sources and the drains 17 of the switching thin film transistor 2 and the driving thin film transistor 1 on the base substrate 10 on which the preceding steps are all finished by a patterning process, so that the sources and the drains 17 of the switching thin film transistor 2 and the driving thin film transistor 1 are respectively connected to the respective active regions 11 through the contact vias 16.

Each of the sources and the drains 17 may be made of one of molybdenum (Mo), molybdenum-niobium alloy (MoNb), aluminum (Al), aluminum-neodymium alloy (AlNd), titanium (Ti), and copper (Cu), or each of the sources and the drains 17 may be of single-layered or may be a multi-layered composite laminated layer which is made of several materials among the above listed materials.

Of course, after the preceding steps are all finished, the following steps may further be included: forming a passivation layer covering the sources and the drains 17; forming the contact via 16 penetrating through the passivation layer on the drain (or the source) of the driving thin film transistor 1; forming a pixel electrode layer on the passivation layer, so that the pixel electrode layer is connected to the drain (or the source) through the contact via penetrating through the passivation layer; forming a pixel defining layer (PDL) on the pixel electrode layer which serves as an anode layer of an organic electroluminescent device; and evaporating and coating a light-emitting layer and a cathode layer required for the light-emitting layer on the pixel electrode layer.

It should be noted that, the gate 14 of the switching thin film transistor 2 is connected to a scan line, the drain (or the source) of the switching thin film transistor 2 is connected to a data line, and the source (or the drain) of the switching thin film transistor 2 is connected to the gate 14 of the driving thin film transistor 1. The source (or the drain) of the driving thin film transistor 1 is connected to a power line, and the drain (or the source) of the driving thin film transistor 1 is connected to an anode of an OLED. A cathode of the OLED is grounded, and a storage capacitor is connected between the source (or the drain) and the gate 14 of the driving thin film transistor 1.

The above methods explain specific manufacturing methods of the OLED array substrate in a case where each of the switching thin film transistor 2 and the driving thin film transistor 1 is a top-gate type thin film transistor. In a case where each of the switching thin film transistor 2 and the driving thin film transistor 1 is a bottom-gate type thin film transistor, a manufacturing method of the OLED array substrate is similar to the above methods and differs from the above methods in that:

Firstly, the gates 14 of the switching thin film transistor 2 and the driving thin film transistor 1 are formed on the base substrate 10 by processes such as sputtering, exposure, development, etching, stripping off, and the like. The gate insulating layers are formed on the gates 14 of the switching thin film transistor 2 and the driving thin film transistor 1 by a process such as plasma enhanced chemical vapor deposition or the like, wherein, the gate insulating layer of the driving thin film transistor 1 has the first thickness 12-1, the gate insulating layer of the switching thin film transistor 2 has the second thickness 12-2, and the first thickness 12-1 is greater than the second thickness 12-2. The protection layer 13 is formed on the gate insulating layers. The active regions 11 are formed on the protection layer 13 by processes such as sputtering, exposure, development, etching, stripping off, and the like. An etch stop layer (ESL) is formed on the active regions 11 by processes such as sputtering, exposure, development, etching, stripping off, and the like. The sources and the drains 17 of the switching thin film transistor 2 and the driving thin film transistor 1 are formed on the etch stop layer by processes such as sputtering, exposure, development, etching, stripping off, and the like, and the sources and the drains 17 are respectively connected to the respective active regions through the contact vias 16 penetrating through the etch stop layer. Other steps of this method are the same as those as described above, and detailed description thereof is omitted.

Of course, a type of the switching thin film transistor 2 may be different from that of the driving thin film transistor 1. That is, the switching thin film transistor 2 is a top-gate type thin film transistor, and the driving thin film transistor 1 is a bottom-gate type thin film transistor; alternatively, the switching thin film transistor 2 is a bottom-gate type thin film transistor, and the driving thin film transistor 1 is a top-gate type thin film transistor. In this case, the switching thin film transistor 2 and the driving thin film transistor 1 may be formed separately during fabrication of the OLED array substrate, as long as it is ensured that the thickness of the gate insulating layer of the driving thin film transistor 1 is greater than the thickness of the gate insulating layer of the switching thin film transistor 2. A manufacturing method of each of the thin film transistors is the same as the above methods, and detailed description thereof is omitted.

Embodiment 3

The present embodiment provides a display panel including the array substrate according to Embodiment 1.

Since the display panel according to the present embodiment includes the array substrate according to Embodiment 1, the thickness of the gate insulating of the driving thin film transistor 1 is greater than that of the gate insulating of the switching thin film transistor 2, that is, the S factor of the driving thin film transistor 1 is larger than that of the switching thin film transistor 2. In this case, an electric current changes with a voltage more greatly in the switching thin film transistor 2 because the S factor of the switching thin film transistor 2 is relatively smaller, whereas an electric current changes with a voltage more slightly in the driving thin film transistor 1 because the S factor of the driving thin film transistor 1 is relatively larger. Thus, it can be ensured that the switching thin film transistor 2 has higher switching performance and display of grayscale can be controlled better.

Embodiment 4

The present embodiment provides a display device including the display panel according to Embodiment 3. The display device may be any product or component having a display function, such as a mobile phone, a tablet computer, a television set, a display, a laptop computer, a digital photo frame, a navigator, and the like.

Since the display device according to the present embodiment includes the display panel according to Embodiment 3, the thickness of the gate insulating of the driving thin film transistor 1 is greater than that of the gate insulating of the switching thin film transistor 2, that is, the S factor of the driving thin film transistor 1 is larger than that of the switching thin film transistor 2. In this case, an electric current changes with a voltage more greatly in the switching thin film transistor 2 because the S factor of the switching thin film transistor 2 is relatively smaller, whereas an electric current changes with a voltage more slightly in the driving thin film transistor 1 because the S factor of the driving thin film transistor 1 is relatively larger. Thus, it can be ensured that the switching thin film transistor 2 has higher switching performance and display can be performed better.

Of course, the display device according to the present embodiment may further include other traditional structures such as a power supply unit, a display driving unit, and the like.

It should be understood that, the above embodiments are only exemplary embodiments for the purpose of explaining the principle of the present invention, and the present invention is not limited thereto. For a person having ordinary skill in the art, various improvements and modifications may be applied to the present invention without departing from the spirit and essence of the present invention. These improvements and modifications also fall within the protection scope of the present invention.

What is claimed is:

1. An OLED array substrate including a switching thin film transistor and a driving thin film transistor, wherein, an S factor of the switching thin film transistor is less than that of the driving thin film transistor;

wherein, the switching thin film transistor and the driving thin film transistor respectively include an active region, a gate, and a gate insulating layer insulatedly separating the active region and the gate from each other, the gate insulating layer of the driving thin film transistor has a first thickness, and the gate insulating layer of the switching thin film transistor has a second thickness;

wherein, the second thickness of the gate insulating layer of the switching thin film transistor ranges from 600 nm to 800 nm; and the first thickness of the gate insulating layer of the driving thin film transistor ranges from 800 nm to 2000 nm.

2. The OLED array substrate according to claim 1, wherein, the switching thin film transistor is a top-gate type thin film transistor or a bottom-gate type thin film transistor; and the driving thin film transistor is a top-gate type thin film transistor or a bottom-gate type thin film transistor.

* * * * *